(12) United States Patent
Xu et al.

(10) Patent No.: US 11,476,506 B2
(45) Date of Patent: Oct. 18, 2022

(54) DAISY-CHAIN BATTERY CELLS SYSTEM WITH DIFFERENTIAL COMMUNICATION INTERFACES

(71) Applicant: Chengdu Monolithic Power Systems Co., Ltd., Chengdu (CN)

(72) Inventors: Min Xu, Hangzhou (CN); Kai Chen, Chengdu (CN); Xiaohong Li, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 468 days.

(21) Appl. No.: 16/711,394

(22) Filed: Dec. 11, 2019

(65) Prior Publication Data

US 2020/0194844 A1 Jun. 18, 2020

(30) Foreign Application Priority Data

Dec. 13, 2018 (CN) .......................... 201811522246.X (51) Int. Cl.
*H01M 10/42* (2006.01)
*G01R 31/396* (2019.01)
(Continued)

(52) U.S. Cl.
CPC ...... *H01M 10/425* (2013.01); *G01R 31/3835* (2019.01); *G01R 31/396* (2019.01);
(Continued)

(58) Field of Classification Search
CPC ............. H01M 10/425; H01M 10/482; H01M 2010/4278; H01M 50/20; H01M 50/528;
(Continued)

(56) References Cited

U.S. PATENT DOCUMENTS

2013/0187610 A1* 7/2013 Hayashi .................... H02J 7/00
320/118
2021/0156927 A1* 5/2021 Hatani ................ H01M 50/569

FOREIGN PATENT DOCUMENTS

JP 2014215136 A * 11/2014

OTHER PUBLICATIONS

UM10204 I2C-bus specification and user manual, NXP Semiconductors, Rev. 6, 2014 (Year: 2014).*
(Continued)

*Primary Examiner* — Daniel R Miller
(74) *Attorney, Agent, or Firm* — Perkins Coie LLP (57) ABSTRACT

A daisy-chain battery cells system having a plurality of differential communication interfaces $\{F(i), i=1, \ldots, N\}$ respectively coupled to a plurality of voltage measuring modules $\{S(i), i=1, \ldots, N\}$ for a plurality of battery cells $\{C(i), i=1, \ldots, N\}$. For each $i=1, \ldots, N-1$, a first high side differential pin pair (CLU(i)+, CLU(i)−) of the $i^{th}$ differential communication interface F(i) is coupled to a first low side differential pin pair (CLL(i+1)+, CLL(i+1)−) of the $(i+1)^{th}$ differential communication interface F(i+1), and a second high side differential pin pair (DAU(i)+, DAU(i)−) of the $i^{th}$ differential communication interface F(i) is coupled to a second low side differential pin pair (DAL(i+1)+, DAL(i+1)−) of the $(i+1)^{th}$ differential communication interface F(i+1). A low side interface FL(1) of the first differential communication interface F(1) is coupled to a controller. A high side interface FU(N) of the $N^{th}$ differential communication interface F(N) may receive a preset data/signal.

14 Claims, 5 Drawing Sheets

(51) Int. Cl.
  *G01R 31/3835* (2019.01)
  *H01M 10/48* (2006.01)
  *H04L 67/12* (2022.01)
  *H03K 19/0175* (2006.01)

(52) U.S. Cl.
  CPC .. *H01M 10/482* (2013.01); *H03K 19/017509* (2013.01); *H04L 67/12* (2013.01); *H01M 2010/4278* (2013.01)

(58) Field of Classification Search
  CPC .............. G01R 31/3835; G01R 31/396; H03K 19/017509; H03K 19/0175; H04L 67/12; H04L 12/10; H04L 69/32; Y02E 60/10
  See application file for complete search history.

(56) References Cited

OTHER PUBLICATIONS

Level Shifting Techniques in I2C-Bus Design, Nov. 14, 2012 (Year: 2012).*

Datasheet, NXP Semiconductors, PCA9615 2-channel multipoint Fast-mode Plus differential I2C-bus buffer with hot-swap logic, Rev. 1.1, May 10, 2016 (Year: 2016).*

* cited by examiner

DAISY-CHAIN BATTERY CELLS SYSTEM WITH DIFFERENTIAL COMMUNICATION INTERFACES

CROSS-REFERENCE TO RELATED APPLICATION(S)

This application claims the benefit of CN application No. 201811522246.X filed on Dec. 13, 2018 and incorporated herein by reference.

TECHNICAL FIELD

This disclosure relates generally to electrical circuits, and more particularly but not exclusively relates to a daisy-chain battery cells system having differential communication interfaces.

BACKGROUND

In battery-powered high voltage systems, a plurality of battery cells or battery cell groups are usually connected in series to provide the required high voltage. A corresponding plurality of voltage measuring modules are generally needed with each one of the plurality of voltage measuring modules configured to measure the voltage of a corresponding one of the plurality of battery cells or battery cell groups. Typically, a controller (e.g. a MCU) will address each one of the plurality of voltage measuring modules to exchange data (e.g. to read the measured voltage of each one of the plurality of battery cells or battery cell groups) so as to implement under voltage protection, over voltage protection and other control functions.

SUMMARY

In accordance with an embodiment of the present disclosure, a daisy-chain battery cells system is disclosed. The daisy-chain battery cells system may comprise a plurality of battery cells or battery cell groups $\{C(i), i=1, \ldots, N\}$ connected in series between a low side terminal and a high side terminal, wherein N is an integer greater than 1. The daisy-chain battery cells system may further comprise a corresponding plurality of voltage measuring modules $\{S(i), i=1, \ldots, N\}$, wherein each one of the corresponding plurality of voltage measuring modules $\{S(i), i=1, \ldots, N\}$ is coupled to a corresponding one of the plurality of battery cells or battery cell groups $\{C(i), i=1, \ldots, N\}$ and is configured to measure the voltage of the corresponding one battery cell or battery cell group. The daisy-chain battery cells system may further comprise a corresponding plurality of differential communication interfaces $\{F(i), i=1, \ldots, N\}$, wherein each one of the corresponding plurality of differential communication interfaces $\{F(i), i=1, \ldots, N\}$ is coupled to a corresponding one of the plurality of voltage measuring modules $\{S(i), i=1, \ldots, N\}$.

For each $i=1, \ldots, N$, the ith differential communication interface $F(i)$ comprises a low side interface $FL(i)$ and a high side interface $FU(i)$, and wherein the low side interface $FL(i)$ comprises a first low side differential pin pair $(CLL(i)+, CLL(i)-)$ and a second low side differential pin pair $(DAL(i)+, DAL(i)-)$, and wherein the high side interface $FU(i)$ comprises a first high side differential pin pair $(CLU(i)+, CLU(i)-)$ and a second high side differential pin pair $(DAU(i)+, DAU(i)-)$.

For each $i=1, \ldots, N-1$, the first low side differential pin pair $(CLL(i)+, CLL(i)-)$ of the ith differential communication interface $F(i)$ may be configured as a differential input pin pair, the first high side differential pin pair $(CLU(i)+, CLU(i)-)$ of the ith differential communication interface $F(i)$ may be configured as a differential output pin pair and be coupled to the first low side differential pin pair $(CLL(i+1)+, CLL(i+1)-)$ of the $(i+1)$th differential communication interface $F(i+1)$, the second low side differential pin pair $(DAL(i)+, DAL(i)-)$ of the ith differential communication interface $F(i)$ may be configured as a differential input/output pin pair, and the second high side differential pin pair $(DAU(i)+, DAU(i)-)$ of the ith differential communication interface $F(i)$ may be configured as a differential input/output pin pair and is coupled to the second low side differential pin pair $(DAL(i+1)+, DAL(i+1)-)$ of the $(i+1)$th differential communication interface $F(i+1)$. The low side interface $FL(1)$ of the first differential communication interface $F(1)$ may be coupled to a controller. The high side interface $FU(N)$ of the Nth differential communication interface $F(N)$ may be configured to receive a preset data/signal.

For each $i=1, \ldots, N$, a logic high on the pin $CLL(i)+$ with a logic low on the pin $CLL(i)-$ may indicate a logic high of a data/signal $CLL(i)$ transmitted on the first low side differential pin pair $(CLL(i)+, CLL(i)-)$, and a logic low on the pin $CLL(i)+$ with a logic high on the pin $CLL(i)-$ may indicate a logic low of the data/signal $CLL(i)$ transmitted on the first low side differential pin pair $(CLL(i)+, CLL(i)-)$. For each $i=1, \ldots, N$, a logic high on the pin $DAL(i)+$ with a logic low on the pin $DAL(i)-$ may indicate a logic high of a data/signal $DAL(i)$ transmitted on the second low side differential pin pair $(DAL(i)+, DAL(i)-)$, and a logic low on the pin $DAL(i)+$ with a logic high on the pin $DAL(i)-$ may indicate a logic low of the data/signal $DAL(i)$ transmitted on the second low side differential pin pair $(DAL(i)+, DAL(i)-)$. For each $i=1, \ldots, N$, a logic high on the pin $CLU(i)+$ with a logic low on the pin $CLU(i)-$ may indicate a logic high of a data/signal $CLU(i)$ transmitted on the first high side differential pin pair $(CLU(i)+, CLU(i)-)$, and a logic low on the pin $CLU(i)+$ with a logic high on the pin $CLU(i)-$ may indicate a logic low of the data/signal $CLU(i)$ transmitted on the first high side differential pin pair $(CLU(i)+, CLU(i)-)$. For each $i=1, \ldots, N$, a logic high on the pin $DAU(i)+$ with a logic low on the pin $DAU(i)-$ may indicate a logic high of a data/signal $DAU(i)$ transmitted on the second high side differential pin pair $(DAU(i)+, DAU(i)-)$, and a logic low on the pin $DAU(i)+$ with a logic high on the pin $DAU(i)-$ may indicate a logic low of the data/signal $DAU(i)$ transmitted on the second high side differential pin pair $(DAU(i)+, DAU(i)-)$ The first low side differential pin pair $(CLL(1)+, CLL(1)-)$ of the first differential communication interface $F(1)$ may be configured as a clock input pin pair to receive a clock signal sent by the controller, and the second low side differential pin pair $(DAL(1)+, DAL(1)-)$ of the first differential communication interface $F(1)$ may be configured as a data transmission pin pair to receive instructions/data from the controller and/or to send feedback data to the controller. For each $i=2, \ldots, N$, the first low side differential pin pair $(CLL(i)+, CLL(i)-)$ of the ith differential communication interface $F(i)$ may be configured as a clock input pin pair to receive a clock signal sent by the first high side differential pin pair $(CLU(i-1)+, CLU(i-1)-)$ of the $(i-1)$th differential communication interface $F(i-1)$, and the second low side differential pin pair $(DAL(i)+, DAL(i)-)$ of the ith differential communication interface $F(i)$ may be configured as a data transmission pin pair to receive instructions/data from the second high side differential pin pair $(DAU(i-1)+, DAU(i-1)-)$ of the $(i-1)$th differential communication interface F(i−1) and/or to send feedback data to the second high side differential pin pair (DAU(i−1)+, DAU(i−1)−) of the (i−1)th differential communication interface F(i−1).

For each i=1, . . . , N, the high side interface FU(i) of the ith differential communication interface F(i) may comprise: a high side transmission protocol management module having a first high side differential output pin pair (SCLU+_OUT, SCLU−_OUT), a second high side differential input pin pair (SDAU+_IN, SDAU−_IN) and a second high side differential output pin pair (SDAU+_OUT, SDAU−_OUT); a first high side driver, configured to enhance a pull up ability of the positive pin SCLU+_OUT of the first high side differential output pin pair (SCLU+_OUT, SCLU−_OUT) and to couple it to the positive pin CLU(i)+ of the first high side differential pin pair (CLU(i)+, CLU(i)−), and further configure to enhance the pull down ability of the negative pin SCLU−_OUT of the first high side differential output pin pair (SCLU+_OUT, SCLU−_OUT) and to couple it to the negative pin CLU(i)− of the first high side differential pin pair (CLU(i)+, CLU(i)−); a second high side driver, coupled between the positive pin SDAU+_OUT of the second high side differential output pin pair (SDAU+_OUT, SDAU−_OUT) and the positive pin DAU(i)+ of the second high side differential pin pair (DAU(i)+, DAU(i)−), and configured to enhance a pull up ability of the positive pin SDAU+_OUT; and a third high side driver, coupled between the negative pin SDAU−_OUT of the second high side differential output pin pair (SDAU+_OUT, SDAU−_OUT) and the negative pin DAU(i)− of the second high side differential pin pair (DAU(i)+, DAU(i)−), and configured to enhance a pull down ability of the negative pin SDAU−_OUT. The positive pin SDAU+_IN and the negative pin SDAU−_IN of the second high side differential input pin pair (SDAU+_IN, SDAU−_IN) may respectively be coupled to the positive pin DAU(i)+ and the negative pin DAU(i)− of the second high side differential pin pair (DAU(i)+, DAU(i)−).

For each i=1, . . . , N, the low side interface FL(i) of the ith differential communication interface F(i) may comprise: a low side transmission protocol management module having a first low side differential input pin pair (SCLL+_IN, SCLL−_IN), a second low side differential input pin pair (SDAL+_IN, SDAL−_IN) and a second low side differential output pin pair (SDAL+_OUT, SDAL−_OUT); a first low side driver, configured to enhance a pull up ability of the positive pin SDAL+_OUT of the second low side differential output pin pair (SDAL+_OUT, SDAL−_OUT) and to couple the positive pin SDAL+_OUT of the second low side differential output pin pair (SDAL+_OUT, SDAL−_OUT) to the positive pin DAL(i)+ of the second low side differential pin pair (DAL(i)+, DAL(i)−); and a second low side driver, configured to enhance a pull down ability of the negative pin SDAL−_OUT of the second low side differential output pin pair (SDAL+_OUT, SDAL−_OUT) and to couple the negative pin SDAL−_OUT of the second low side differential output pin pair (SDAL+_OUT, SDAL−_OUT) to the negative pin DAL(i)− of the second low side differential pin pair (DAL(i)+, DAL(i)−). The positive pin SCLL+_IN and the negative pin SCLL−_IN of the first low side differential input pin pair (SCLL+_IN, SCLL−_IN) may respectively be coupled to the positive pin CLL(i)+ and the negative pin CLL(i)− of the first low side differential pin pair (CLL(i)+, CLL(i)−), and the positive pin SDAL+_IN and the negative pin SDAL−_IN of the second low side differential input pin pair (SDAL+_IN, SDAL−_IN) may respectively be coupled to the positive pin DAL(i)+ and the negative pin DAL(i)− of the second low side differential pin pair (DAL(i)+, DAL(i)−).

For each i=1, . . . , N, the ith differential communication interface F(i) has a read/write data transaction structure comprising a read/write beginning code, an address code, a read/write indicating code, a data code and a read/write ending code.

The read/write beginning code may be actuated by the controller, wherein once the signal/data DAL(i) transmitted at the second low side differential pin pair (DAL(i)+, DAL(i)−) changes from logic high to logic low while the signal/data CLL(i) transmitted at the first low side differential pin pair (CLL(i)+, CLL(i)−) is logic high, the read/write beginning code indicates the ith differential communication interface F(i) is beginning with a read/write transmission.

The read/write ending code may also be actuated by the controller, wherein once the signal/data DAL(i) transmitted at the second low side differential pin pair (DAL(i)+, DAL(i)−) changes from logic low to logic high while the signal/data CLL(i) transmitted at the first low side differential pin pair (CLL(i)+, CLL(i)−) is logic high, the read/write ending code indicates the ith differential communication interface F(i) is terminating a current read/write transmission.

When the read/write indicating code is logic high, it may indicate that the ith differential communication interface F(i) is currently processing a read transmission, and when the read/write indicating code is logic low, it may indicate that the ith differential communication interface F(i) is currently processing a write transmission.

Once the read/write beginning code indicates that the ith differential communication interface F(i) is beginning with a read/write transmission, the ith differential communication interface F(i) starts to process a current read/write transmission with its second low side differential pin pair (DAL(i)+, DAL(i)−) and its second high side differential pin pair (DAU(i)+, DAU(i)−) starting to transmit the address code, the read/write indicating code and the data code, and wherein the read/write transmission is processed in bytes with each byte followed by a 1 bit acknowledge code.

During a write transmission to write data/command into the plurality of differential communication interfaces {F(i), i=1, . . . , N}, the acknowledge code is used to inform the emitter which sends the data/command to the second low side differential pin pair (DAL(i)+, DAL(i)−) of the ith differential communication interface F(i) that a current byte transmission is completed and a next byte can be sent out.

During a read transmission to read data/command from the plurality of differential communication interfaces {F(i), i=1, . . . , N}, the acknowledge code may be used to inform the emitter which sends the data/command to the second high side differential pin pair (DAU(i)+, DAU(i)−) of the ith differential communication interface F(i) that a current byte transmission is completed and a next byte can be sent out.

For each i=1, . . . , N, the signal/data CLL(i) transmitted on the first low side differential pin pair (CLL(i)+, CLL(i)−) of the ith differential communication interface F(i) may be used as a clock signal CLL(i), and the second low side differential pin pair (DAL(i)+, DAL(i)−) of the ith differential communication interface F(i) may be configured to process read of each bit of the data/command DAL(i) transmitted to the second low side differential pin pair (DAL(i)+, DAL(i)−) at each logic high pulse of the clock signal CLL(i). The logic state of the data/command DAL(i) on the second low side differential pin pair (DAL(i)+, DAL(i)−) remains unchanged during the logic high pulse of the clock signal CLL(i) and can only be changed when the clock signal CLL(i) is logic low.

For each i=1, . . . , N, the signal/data CLU(i) transmitted on the first high side differential pin pair (CLU(i)+, CLU (i)−) of the ith differential communication interface F(i) is used as a clock signal CLU(i), and wherein the second high side differential pin pair (DAU(i)+, DAU(i)−) of the ith differential communication interface F(i) is configured to process write of each bit of the data/command DAU(i) transmitted to high side differential pin pair (DAU(i)+, DAU(i)−) at each logic high pulse of the clock signal CLU(i). The logic state of the data/command DAU(i) on the second high side differential pin pair (DAU(i)+, DAU(i)−) remains unchanged during the logic high pulse of the clock signal CLU(i) and can only be changed when the clock signal CLU(i) is logic low.

For each i=1, . . . , N, the ith differential communication interface F(i) may further comprise a first level shift circuit coupled between the first low side differential pin pair (CLL(i)+, CLL(i)−) and the first high side differential pin pair (CLU(i)+, CLU(i)−) and configured to provide a first predetermined voltage level, and a second level shift circuit coupled between the second low side differential pin pair (DAL(i)+, DAL(i)−) and the second high side differential pin pair (DAU(i)+, DAU(i)−) and configured to provide a second predetermined voltage level.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Those skilled in the art should understand that the meanings of the terms identified above do not necessarily limit the terms, but merely provide illustrative examples for the terms.

Figure 1:
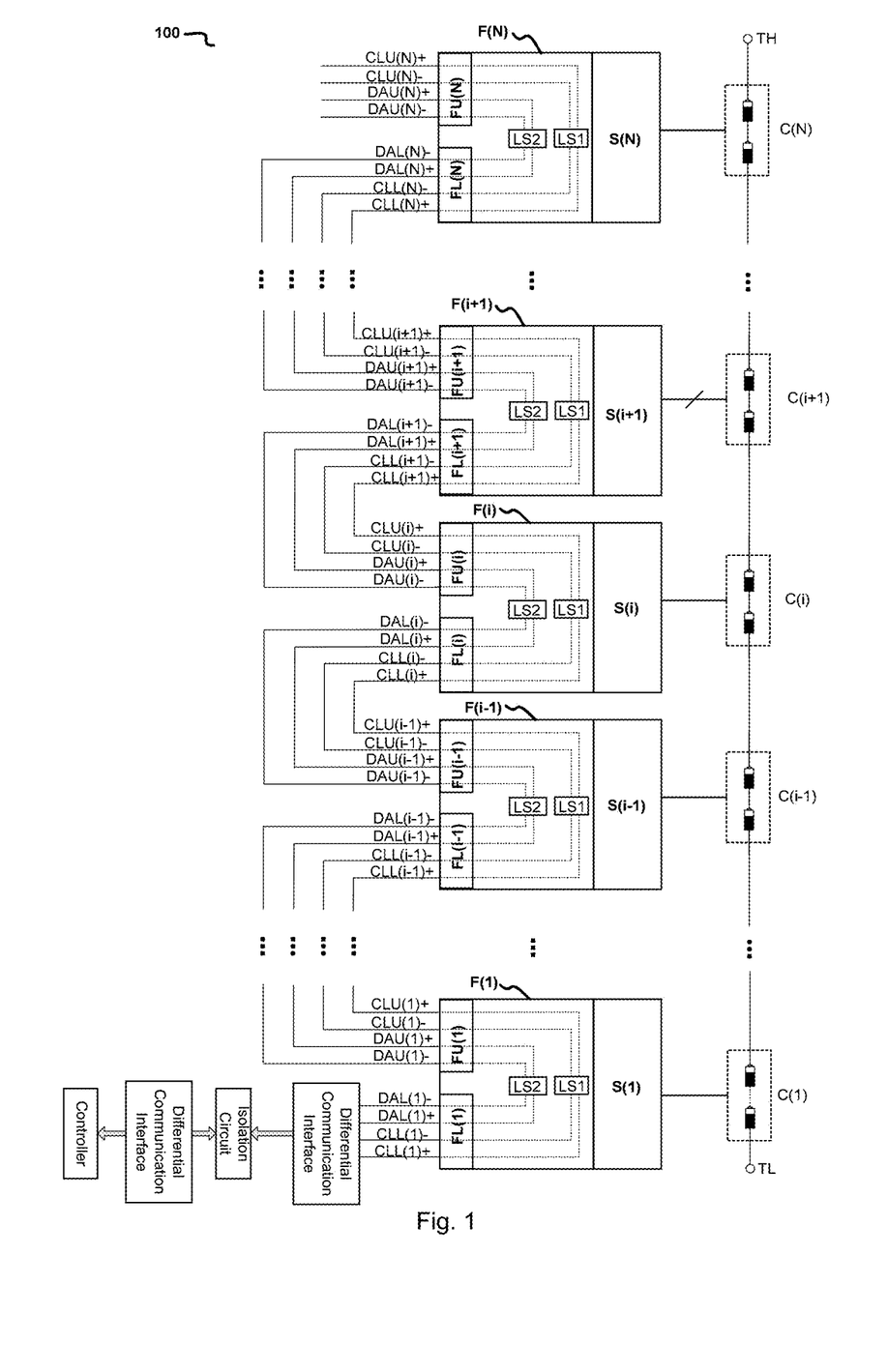
FIG. 1 illustrates a block diagram of a daisy-chain battery cells system 100 in accordance with an embodiment of the present invention.

FIG. 1 illustrates a block diagram of a daisy-chain battery cells system 100 in accordance with an embodiment of the present invention. The daisy-chain battery cells system 100 may comprise a plurality of battery cells or battery cell groups labeled with {C(i), i=1, . . . , N} and connected in series between a low side terminal TL and a high side terminal TH, wherein N can be an integer greater than 1 properly chosen according to practical application requirements. The daisy-chain battery cells system 100 may further comprise a corresponding plurality of voltage measuring modules {S(i), i=1, . . . , N}, wherein each one of the corresponding plurality of voltage measuring modules {S(i), i=1, . . . , N} is coupled to a corresponding one of the plurality of battery cells or battery cell groups {C(i), i=1, . . . , N} and is configured to measure the voltage of the corresponding one battery cell or battery cell group. That is to say, the ith voltage measuring module S(i) is coupled to a corresponding ith battery cell/battery cell group C(i) and is configured to measure the voltage of the corresponding ith battery cell or battery cell group C(i), for each i=1, . . . , N.

In accordance with an embodiment of the present invention, the daisy-chain battery cells system 100 may further comprise a corresponding plurality of differential communication interfaces {F(i), i=1, . . . , N}, wherein each one of the corresponding plurality of differential communication interfaces {F(i), i=1, . . . , N} is coupled to a corresponding one of the plurality of voltage measuring modules {S(i), i=1, . . . , N}. That is to say, for each i=1, . . . , N, the ith differential communication interface F(i) is coupled to the corresponding ith voltage measuring module S(i). For each i=1, . . . , N, the ith differential communication interface F(i) may be configured to receive and transmit data of the corresponding ith voltage measuring module S(i). Each one of the corresponding plurality of differential communication interfaces {F(i), i=1, . . . , N}, e.g. the ith differential communication interface F(i) for each i=1, . . . , N, may comprise a low side interface FL(i) and a high side interface FU(i), wherein the low side interface FL(i) may comprise a first low side differential pin pair (CLL(i)+, CLL(i)−) and a second low side differential pin pair (DAL(i)+, DAL(i)−), and wherein the high side interface FU(i) may comprise a first high side differential pin pair (CLU(i)+, CLU(i)−) and a second high side differential pin pair (DAU(i)+, DAU(i)−).

In accordance with an embodiment of the present invention, still referring to FIG. 1, for each i=1, ..., N−1, the first low side differential pin pair (CLL(i)+, CLL(i)−) of the ith differential communication interface F(i) may be configured as a differential input pin pair, the first high side differential pin pair (CLU(i)+, CLU(i)−) of the ith differential communication interface F(i) may be configured as a differential output pin pair and be coupled to the first low side differential pin pair (CLL(i+1)+, CLL(i+1)−) of an upstream differential communication interface F(i+1) (i.e. the (i+1)th differential communication interface F(i+1)), the second low side differential pin pair (DAL(i)+, DAL(i)−) of the ith differential communication interface F(i) may be configured as a differential input/output pin pair, the second high side differential pin pair (DAU(i)+, DAU(i)−) of the ith differential communication interface F(i) may also be configured as a differential input/output pin pair and may be coupled to the second low side differential pin pair (DAL(i+1)+, DAL(i+1)−) of the (i+1)th differential communication interface F(i+1). The low side interface FL(1) of the first differential communication interface F(1) may be coupled to a controller. An isolation module may be coupled between the first differential communication interface F(1) and the controller. For instance, the first low side differential pin pair (CLL(1)+, CLL(1)−) and the second low side differential pin pair (DAL(1)+, DAL(1)−) of the first differential communication interface F(1) may respectively be coupled to the controller through differential communication interfaces. The high side interface FU(N) of the $N^{th}$ differential communication interface F(N) may be configured to receive a preset data/signal. For instance, the first high side differential pin pair (CLU(N)+, CLU(N)−) of the high side interface FU(N) may be coupled to a logic high data/signal and the second high side differential pin pair (DAU(N)+, DAU(N)−) of the high side interface FU(N) may also be coupled to a logic high data/signal. The controller may address and communicate with the plurality of voltage measuring modules {S(i), i=1, ..., N} through the corresponding plurality of differential communication interfaces {F(i), i=1, ..., N} to transmit data. Since the plurality of differential communication interfaces {F(i), i=1, ..., N} are daisy-chain coupled to one another and can transmit data in series, the controller does not need to directly communicate with each one of the plurality of differential communication interfaces {F(i), i=1, ..., N}, and thus there is no need to provide an isolation circuit for each one of the plurality of differential communication interfaces {F(i), i=1, ..., N}, saving cost and chip area.

In accordance with an embodiment of the present invention, for each i=1, ..., N, when the pin CLL(i)+ is logic high and the pin CLL(i)− is logic low, it indicates that the data/signal CLL(i) transmitted on the first low side differential pin pair (CLL(i)+, CLL(i)−) is logic high; when the pin CLL(i)+ is logic low and the pin CLL(i)− is logic high, it indicates that the data/signal CLL(i) transmitted on the first low side differential pin pair (CLL(i)+, CLL(i)−) is logic low. For each i=1, ..., N, when the pin DAL(i)+ is logic high and the pin DAL(i)− is logic low, it indicates that the data/signal DAL(i) transmitted on the second low side differential pin pair (DAL(i)+, DAL(i)−) is logic high; when the pin DAL(i)+ is logic low and the pin DAL(i)− is logic high, it indicates that the data/signal DAL(i) transmitted on the second low side differential pin pair (DAL(i)+, DAL(i)−) is logic low. For each i=1, ..., N, when the pin CLU(i)+ is logic high and the pin CLU(i)− is logic low, it indicates that the data/signal CLU(i) transmitted on the first high side differential pin pair (CLU(i)+, CLU(i)−) is logic high; when the pin CLU(i)+ is logic low and the pin CLU(i)− is logic high, it indicates that the data/signal CLU(i) transmitted on the first high side differential pin pair (CLU(i)+, CLU(i)−) is logic low. For each i=1, ..., N, when the pin DAU(i)+ is logic high and the pin DAU(i)− is logic low, it indicates that the data/signal DAU(i) transmitted on the second high side differential pin pair (DAU(i)+, DAU(i)−) is logic high; when the pin DAU(i)+ is logic low and the pin DAU(i)− is logic high, it indicates that the data/signal DAU(i) transmitted on the second high side differential pin pair (DAU(i)+, DAU(i)−) is logic low. In this fashion, correctness of the data/signals CLL(i), DAL(i), CLU(i) and DAU(i) transmitted by the differential communication interface F(i) can be improved.

In accordance with an embodiment of the present invention, the first low side differential pin pair (CLL(1)+, CLL(1)−) of the first differential communication interface F(1) is configured as a clock input pin pair to receive a clock signal sent by the controller, the second low side differential pin pair(DAL(1)+, DAL(1)−) of the first differential communication interface F(1) is configured as a data transmission pin pair to receive instructions/data from the controller and/or to send feedback data to the controller. For each i=2, N, the first low side differential pin pair (CLL(i)+, CLL(i)−) of the ith differential communication interface F(i) is configured as a clock input pin pair to receive a clock signal sent by the first high side differential pin pair (CLU(i−1)+, CLU(i−1)−) of the (i−1)th differential communication interface F(i−1), the second low side differential pin pair (DAL(i)+, DAL(i)−) of the ith differential communication interface F(i) is configured as a data transmission pin pair to receive instructions/data from the second high side differential pin pair (DAU(i−1)+, DAU(i−1)−) of the (i−1)th differential communication interface F(i−1) and/or to send feedback data to the second high side differential pin pair (DAU(i−1)+, DAU(i−1)−) of the (i−1)th differential communication interface F(i−1).

In accordance with an embodiment of the present invention, for each i=1, N, the ith differential communication interface F(i) may further comprise: a first level shift circuit LS1 coupled between the first low side differential pin pair (CLL(i)+, CLL(i)−) and the first high side differential pin pair (CLU(i)+, CLU(i)−) and configured to provide a first predetermined voltage level (also labeled with LS1, e.g. the first predetermined voltage level LS1 may be of 3V or 5V or other levels set according to the circuit requirements) between the first low side differential pin pair (CLL(i)+, CLL(i)−) and the first high side differential pin pair (CLU(i)+, CLU(i)−). The first predetermined voltage level LS1 can allow the first high side differential pin pair (CLU(i)+, CLU(i)−) to be coupled to the first low side differential pin pair (CLL(i+1)+, CLL(i+1)−) of the upstream (i+1)th differential communication interface F(i+1) without having voltage level difference. For each i=1, N, the ith differential communication interface F(i) may further comprise: a second level shift circuit LS2 coupled between the second low side differential pin pair (DAL(i)+, DAL(i)−) and the second high side differential pin pair (DAU(i)+, DAU(i)−) and configured to provide a second predetermined voltage level (also labeled with LS2, e.g. the second predetermined voltage level LS2 may be of 3V or 5V or other levels set according to the circuit requirements) between the second low side differential pin pair (DAL(i)+, DAL(i)−) and the second high side differential pin pair (DAU(i)+, DAU(i)−). The second predetermined voltage level LS2 can allow the second high side differential pin pair (DAU(i)+, DAU(i)−) to be coupled to the first high side differential pin pair (DAL (i+1)+, DAL(i+1)−) of the upstream (i+1)th differential communication interface F(i+1) without having voltage level difference.

Figure 2:
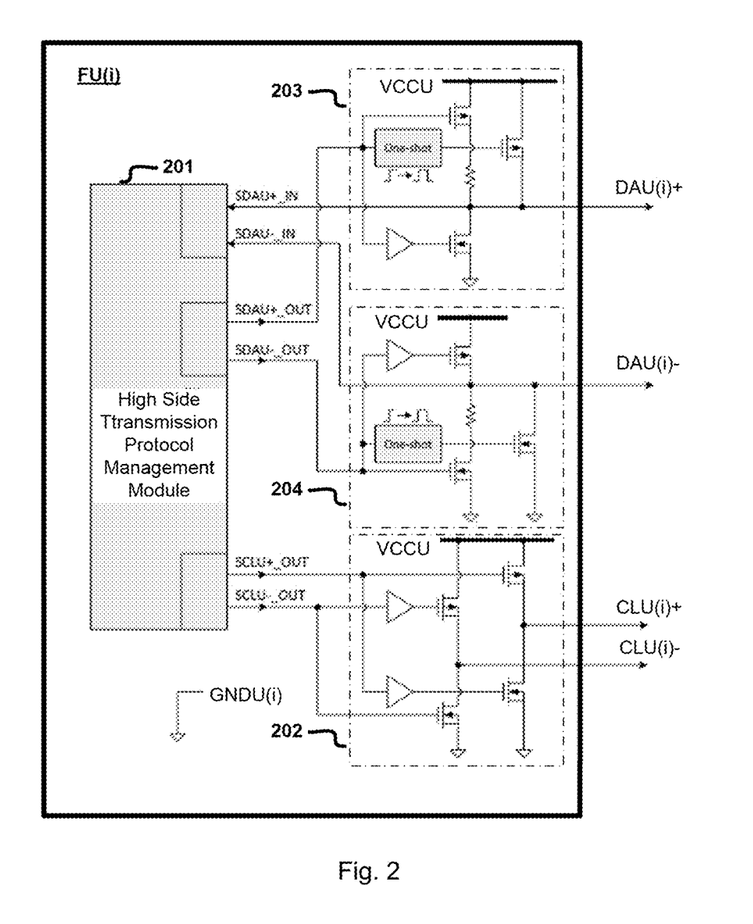
FIG. 2 illustrates a block diagram of the high side interface FU(i) of the ith differential communication interface F(i) (i=1, . . . , N) in accordance with an embodiment of the present invention.

FIG. 2 illustrates a block diagram of the high side interface FU(i) of the ith differential communication interface F(i) (i=1, . . . , N) in accordance with an embodiment of the present invention. The high side interface FU(i) may comprise a high side transmission protocol management module 201, a first high side driver 202 for the first high side differential pin pair (CLU(i)+, CLU(i)−), a second high side driver 203 for the positive pin DAU(i)+ of the second high side differential pin pair (DAU(i)+, DAU(i)−), and a third high side driver 204 for the negative pin DAU(i)− of the second high side differential pin pair (DAU(i)+, DAU(i)−). The high side transmission protocol management module 201 may comprise a first high side differential output pin pair (SCLU+_OUT, SCLU−_OUT), a second high side differential input pin pair (SDAU+_IN, SDAU−_IN) and a second high side differential output pin pair (SDAU+_OUT, SDAU−_OUT). The first high side differential output pin pair (SCLU+_OUT, SCLU−_OUT) is coupled to the first high side differential pin pair (CLU(i)+, CLU(i)−) through the first high side driver 202. The first high side driver 202 is configured to enhance the pull up ability of the positive pin SCLU+_OUT and to couple it to the positive pin CLU(i)+ of the first high side differential pin pair (CLU(i)+, CLU(i)−). The first high side driver 202 is further configure to enhance the pull down ability of the negative pin SCLU−_OUT and to couple it to the negative pin CLU(i)− of the first high side differential pin pair (CLU(i)+, CLU(i)−). The first high side driver 202 can thus enhance the signal/data transmission accuracy and transmission rate from the first high side differential output pin pair (SCLU+_OUT, SCLU−_OUT) to the first high side differential pin pair (CLU(i)+, CLU(i)−). The positive pin SDAU+_OUT of the second high side differential output pin pair (SDAU+_OUT, SDAU−_OUT) is coupled to the positive pin DAU(i)+ of the second high side differential pin pair (DAU(i)+, DAU(i)−) via the second high side driver 203 which is configured to enhance the pull up ability of the positive pin SDAU+_OUT. The negative pin SDAU−_OUT of the second high side differential output pin pair (SDAU+_OUT, SDAU−_OUT) is coupled to the negative pin DAU(i)− of the second high side differential pin pair (DAU(i)+, DAU(i)−) via the third high side driver 204 which is configured to enhance the pull down ability of the negative pin SDAU−_OUT. The second high side driver 203 and the third high side driver 204 can thus enhance the signal/data transmission accuracy and transmission rate from the second high side differential output pin pair (SDAU+_OUT, SDAU−_OUT) to the high side differential pin pair (DAU(i)+, DAU(i)−). The positive pin SDAU+_IN and the negative pin SDAU−_IN of the second high side differential input pin pair (SDAU+_IN, SDAU−_IN) are respectively coupled to the positive pin DAU(i)+ and the negative pin DAU(i)− of the second high side differential pin pair (DAU(i)+, DAU(i)−) to transmit the signal/data DAU(i) received at the second high side differential pin pair (DAU(i)+, DAU(i)−) to the high side transmission protocol management module 201 when the second high side differential pin pair (DAU(i)+, DAU(i)−) are used as an input pin pair.

Figure 3:
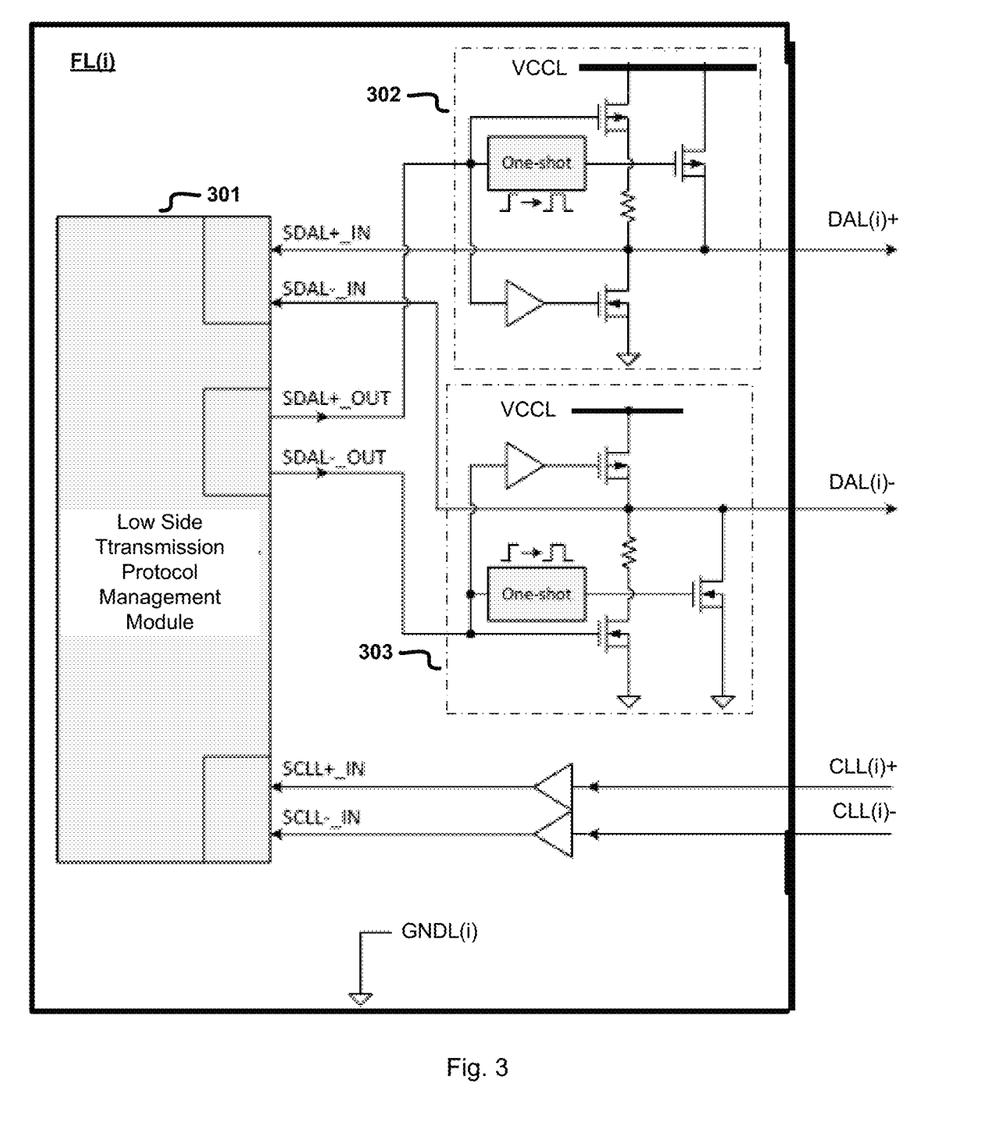
FIG. 3 illustrates a block diagram of the low side interface FL(i) of the ith differential communication interface F(i) (i=1, . . . , N) in accordance with an embodiment of the present invention.

FIG. 3 illustrates a block diagram of the low side interface FL(i) of the ith differential communication interface F(i) (i=1, . . . , N) in accordance with an embodiment of the present invention. The low side interface FL(i) may comprise a low side transmission protocol management module 301, a first low side driver 302 for the positive pin DAL(i)+ of the second low side differential pin pair (DAL(i)+, DAL(i)−), and a second low side driver 303 for the negative pin DAL(i)− of the second low side differential pin pair (DAL(i)+, DAL(i)−). The low side transmission protocol management module 301 may comprise a first low side differential input pin pair (SCLL+_IN, SCLL−_IN), a second low side differential input pin pair (SDAL+_IN, SDAL−_IN) and a second low side differential output pin pair (SDAL+_OUT, SDAL−_OUT). The first low side driver 302 is configured to enhance the pull up ability of the positive pin SDAL+_OUT of the second low side differential output pin pair (SDAL+_OUT, SDAL−_OUT) and to couple the positive pin SDAL+_OUT of the second low side differential output pin pair (SDAL+_OUT, SDAL−_OUT) to the positive pin DAL(i)+ of the second low side differential pin pair (DAL(i)+, DAL(i)−). The second low side driver 303 is configured to enhance the pull down ability of the negative pin SDAL−_OUT of the second low side differential output pin pair (SDAL+_OUT, SDAL−_OUT) and to couple the negative pin SDAL−_OUT of the second low side differential output pin pair (SDAL+_OUT, SDAL−_OUT) to the negative pin DAL(i)− of the second low side differential pin pair (DAL(i)+, DAL(i)−). The first low side driver 302 and the second low side driver 303 can thus enhance the signal/data transmission accuracy and transmission rate from the second low side differential output pin pair (SDAL+_OUT, SDAL−_OUT) to the low side differential pin pair (DAL(i)+, DAL(i)−). The positive pin SCLL+_IN and the negative pin SCLL−_IN of the first low side differential input pin pair (SCLL+_IN, SCLL−_IN) are respectively coupled to the positive pin CLL(i)+ and the negative pin CLL(i)− of the first low side differential pin pair (CLL(i)+, CLL(i)−) to transmit the signal/data CLL(i) received at the first low side differential pin pair (CLL(i)+, CLL(i)−) to the low side transmission protocol management module 301 when the first low side differential pin pair (CLL(i)+, CLL(i)−) are used as an input pin pair. The positive pin SDAL+_IN and the negative pin SDAL−_IN of the second low side differential input pin pair (SDAL+_IN, SDAL−_IN) are respectively coupled to the positive pin DAL(i)+ and the negative pin DAL(i)− of the second low side differential pin pair (DAL(i)+, DAL(i)−) to transmit the signal/data DAL(i) received at the second low side differential pin pair (DAL(i)+, DAL(i)−) to the low side transmission protocol management module 301 when the second low side differential pin pair (DAL(i)+, DAL(i)−) are used as an input pin pair.

Figure 4:
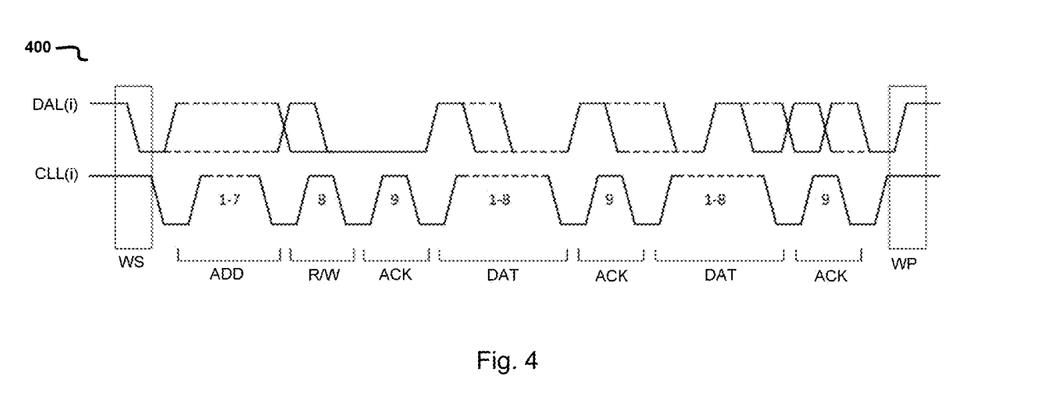
FIG. 4 illustrates an exemplary read/write data transaction structure 400 of the ith differential communication interface F(i) (for each i=1, . . . , N) in accordance with an embodiment of the present invention.

In accordance with an exemplary embodiment of the present invention, as shown in FIG. 4, for each i=1, . . . , N, the ith differential communication interface F(i) may have a read/write data transaction structure 400. The read/write data transaction structure 400 may comprise a read/write beginning code WS, an address code ADD, a read/write indicating code R/W, data code DAT and a read/write ending code WP. In an embodiment, the read/write beginning code WS may be sent out or initiated or issued by the controller. The read/write beginning code WS may indicate the ith differential communication interface F(i) is beginning with a read/write transmission once the signal/data DAL(i) transmitted at the second low side differential pin pair (DAL(i)+, DAL(i)−) changes from logic high to logic low while the signal/data CLL(i) transmitted at the first low side differential pin pair (CLL(i)+, CLL(i)−) is logic high. In an embodiment, the read/write ending code WP may also be sent out by the controller. The read/write ending code WP may indicate the ith differential communication interface F(i) is terminating a current read/write transmission once the signal/data DAL(i) transmitted at the second low side differential pin pair (DAL(i)+, DAL(i)−) changes from logic low to logic high while the signal/data CLL(i) transmitted at the first low side differential pin pair (CLL(i)+, CLL(i)−) is logic high. The read/write indicating code R/W is used to indicate whether the ith differential communication interface F(i) is currently processing a read transmission or processing a write transmission. In an embodiment, when the read/write indicating code R/W is logic high, it indicates that the ith differential communication interface F(i) is currently processing a read transmission, when the read/write indicating code R/W is logic low, it indicates that the ith differential communication interface F(i) is currently processing a write transmission. The read/write data transaction structure 400 has high compatibility.

In accordance with an embodiment of the present invention, as illustrated in FIG. 4, once the read/write beginning code WS indicates that the ith differential communication interface F(i) is beginning with a read/write transmission, the ith differential communication interface F(i) starts to process a current read/write transmission. The second low side differential pin pair (DAL(i)+, DAL(i)−) and the second high side differential pin pair (DAU(i)+, DAU(i)−) start to transmit command/data (e.g. including the address code ADD, the read/write indication code R/W and the data code DAT). The read/write transmission may be processed in bytes with each byte followed by a 1 bit acknowledge code ACK. During a write transmission to write data/command into the plurality of differential communication interfaces {F(i), i=1, . . . , N}, the acknowledge code ACK may be used to inform the emitter (e.g. the high side interface FU(i−1) of the (i−1)th differential communication interface F(i−1) or the controller) which sends the data/command to the second low side differential pin pair (DAL(i)+, DAL(i)−) of the ith differential communication interface F(i) that a current byte transmission is completed and a next byte can be sent out. During a read transmission to read data/command from the plurality of differential communication interfaces {F(i), i=1, . . . , N}, the acknowledge code ACK may be used to inform the emitter (e.g. the low side interface FL(i+1) of the (i+1)th differential communication interface F(i+1) or the controller) which sends the data/command to the second high side differential pin pair (DAU(i)+, DAU(i)−) of the ith differential communication interface F(i) that a current byte transmission is completed and a next byte can be sent out. The data/command length transmitted in a current read/write transmission is not limited but begins when the read/write beginning code WS indicates that the ith differential communication interface F(i) is beginning with a read/write transmission and ends when the read/write ending code WP indicates that the ith differential communication interface F(i) is terminating a current read/write transmission. A next read/write transmission begins when the read/write beginning code WS indicates another transmission is beginning.

In accordance with an embodiment, during a read transmission, for each i=1, . . . , N, the signal/data CLL(i) transmitted on the first low side differential pin pair (CLL(i)+, CLL(i)−) of the ith differential communication interface F(i) may be used as a clock signal CLL(i). The second low side differential pin pair (DAL(i)+, DAL(i)−) of the ith differential communication interface F(i) may process read of each bit of the data/command DAL(i) (may include e.g. the address code ADD, the read/write indication code R/W and the data code DAT etc.) transmitted to the second low side differential pin pair (DAL(i)+, DAL(i)−) at each logic high pulse of the clock signal CLL(i). Processing read of each bit of the data/command DAL(i) may include sending each bit of the data/command DAL(i) to the second high side differential pin pair (DAU(i)+, DAU(i)−) via e.g. the second level shift circuit LS2 and subsequently to the second low side differential pin pair (DAL(i+1)+, DAL(i+1)−) of the (i+1)th differential communication interface F(i+1). During a write transmission, for each i=1, . . . , N, the signal/data CLU(i) transmitted on the first high side differential pin pair (CLU(i)+, CLU(i)−) of the ith differential communication interface F(i) may be used as a clock signal CLU(i). The second high side differential pin pair (DAU(i)+, DAU(i)−) of the ith differential communication interface F(i) may process write of each bit of the data/command DAU(i) (may include e.g. the address code ADD, the read/write indication code R/W and the data code DAT etc.) transmitted to high side differential pin pair (DAU(i)+, DAU(i)−) at each logic high pulse of the clock signal CLU(i). Processing write of each bit of the data/command DAU(i) may include sending each bit of the data/command DAU(i) to the second low side differential pin pair (DAL(i)+, DAL(i)−) via e.g. the second level shift circuit LS2 and subsequently to the second high side differential pin pair (DAU(i−1)+, DAU(i−1)−) of the (i−1)th differential communication interface F(i−1). To ensure the read transmission stability and accuracy, logic state of the data/command DAL(i) on the second low side differential pin pair (DAL(i)+, DAL(i)−) remains unchanged during the logic high pulse of the clock signal CLL(i) and can only be changed when the clock signal CLL(i) is logic low. Analogously, to ensure the write transmission stability and accuracy, logic state of the data/command DAU(i) on the second high side differential pin pair (DAU(i)+, DAU(i)−) remains unchanged during the logic high pulse of the clock signal CLU(i) and can only be changed when the clock signal CLU(i) is logic low.

Figure 5:
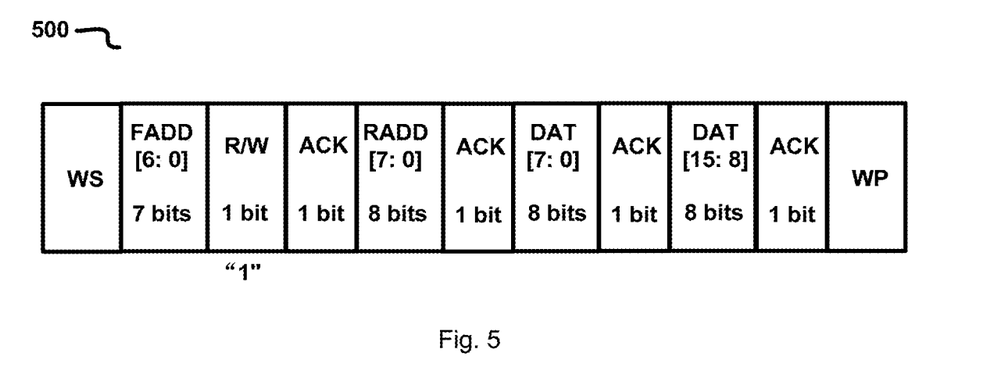
FIG. 5 illustrates an exemplary writing transmission 500 processed by the ith differential communication interface F(i) (for each i=1, . . . , N) in accordance with an embodiment of the present invention.

FIG. 5 illustrates an exemplary writing transmission 500 processed by the ith differential communication interface F(i) (for each i=1, . . . , N) in accordance with an embodiment of the present invention. Once the read/write beginning code WS is received indicating that the ith differential communication interface F(i) is beginning with a read/write transmission, the second low side differential pin pair (DAL(i)+, DAL(i)−) and the second high side differential pin pair (DAU(i)+, DAU(i)−) starts to transmit the following data in sequence: a 7 bits interface address code FADD[6:0] and a 1 bit read/write indicating code R/W (illustrated as logic "1" in FIG. 5 indicating the ith differential communication interface F(i) is currently processing a write transmission) following with a 1 bit acknowledge code ACK, an 8 bits register address code RADD[7:0] following with a 1 bit acknowledge code ACK, an 8 bits lower significant data code DAT[7:0] following with a 1 bit acknowledge code ACK, and an 8 bits higher significant data code DAT[15:8] following with a 1 bit acknowledge code ACK. Subsequently, the read/write ending code WP is received indicating that the ith differential communication interface F(i) is terminating the current write transmission and thus indicating that the current write transmission is completed. Those of ordinary skill in the art should understand that the codes and length processed during the writing transmission 500 illustrated in FIG. 5 are only illustrative and not intended to be limiting.

Figure 6:
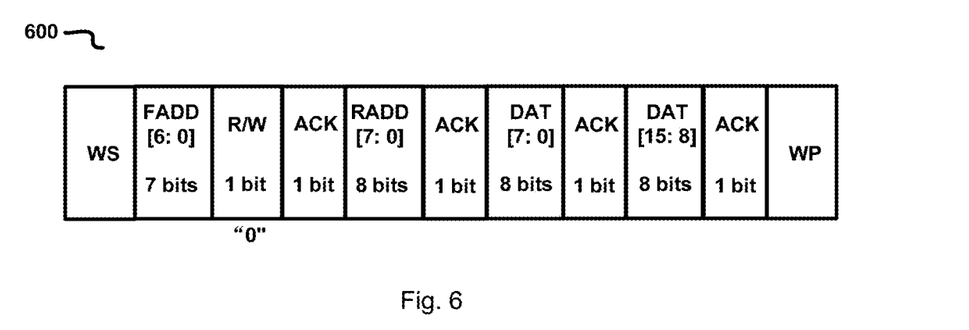
FIG. 6 illustrates an exemplary reading transmission 600 processed by the ith differential communication interface F(i) (for each i=1, . . . , N) in accordance with an embodiment of the present invention.

FIG. 6 illustrates an exemplary reading transmission 600 processed by the ith differential communication interface F(i) (for each i=1, . . . , N) in accordance with an embodiment of the present invention. Once the read/write beginning code WS is received indicating that the ith differential communication interface F(i) is beginning with a read/write transmission, the second low side differential pin pair (DAL (i)+, DAL(i)−) and the second high side differential pin pair (DAU(i)+, DAU(i)−) starts to transmit the following data in sequence: a 7 bits interface address code FADD[6:0] and a 1 bit read/write indicating code R/W (illustrated as logic "0" in FIG. 6 indicating the ith differential communication interface F(i) is currently processing a read transmission) following with a 1 bit acknowledge code ACK, an 8 bits register address code RADD[7:0] following with a 1 bit acknowledge code ACK, an 8 bits lower significant data code DAT[7:0] following with a 1 bit acknowledge code ACK, and an 8 bits higher significant data code DAT[15:8] following with a 1 bit acknowledge code ACK. Subsequently, the read/write ending code WP is received indicating that the ith differential communication interface F(i) is terminating the current read transmission and thus indicating that the current read transmission is completed. Those of ordinary skill in the art should understand that the codes and length processed during the writing transmission 600 illustrated in FIG. 6 are only illustrative and not intended to be limiting.

Figure 7:
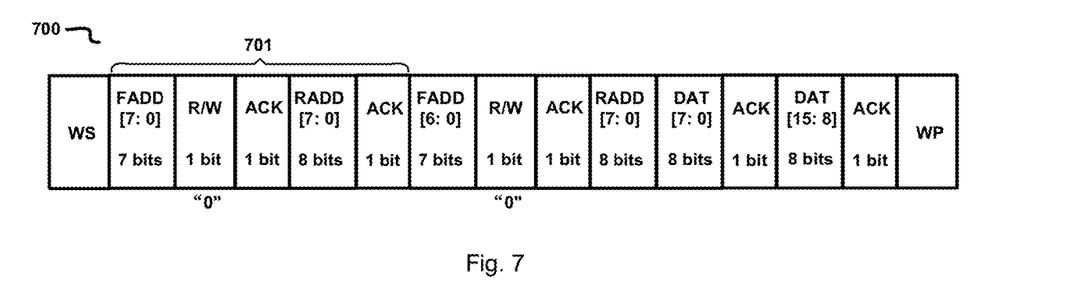
FIG. 7 illustrates an exemplary reading transmission 700 processed by the ith differential communication interface F(i) (for each i=1, . . . , N) in accordance with an alternative embodiment of the present invention.

FIG. 7 illustrates an exemplary reading transmission 700 processed by the ith differential communication interface F(i) (for each i=1, . . . , N) in accordance with an alternative embodiment of the present invention. Once the read/write beginning code WS is received indicating that the ith differential communication interface F(i) is beginning with a read/write transmission, the ith differential communication interface F(i) firstly standby or wait for a write data frame 701 to get ready for processing a read transmission. For instance, the write data frame 701 in the example of FIG. 7 may include a 7 bits interface address code FADD[6:0] and 1 bit read/write indicating code R/W ( ) the second low side differential pin pair (DAL(i)+, DAL(i)−) and the second high side differential pin pair (DAU(i)+, DAU(i)−) starts to transmit the following data in sequence: a 7 bits interface address code FADD[6:0] and a 1 bit read/write indicating code R/W (illustrated as logic "0" in FIG. 7 indicating the ith differential communication interface F(i) is currently processing a read transmission and thus does not write in any data/code) following with a 1 bit acknowledge code ACK, and an 8 bits register address code RADD[7:0] following with a 1 bit acknowledge code ACK. Following the end of the write data frame 701 (after the complete write data frame 701 has been issued), the second low side differential pin pair (DAL(i)+, DAL(i)−) and the second high side differential pin pair (DAU(i)+, DAU(i)−) starts to transmit the following data in sequence: a 7 bits interface address code FADD[6:0] and a 1 bit read/write indicating code R/W (illustrated as logic "0" in FIG. 6 indicating the ith differential communication interface F(i) is currently processing a read transmission) following with a 1 bit acknowledge code ACK, an 8 bits register address code RADD[7:0] following with a 1 bit acknowledge code ACK, an 8 bits lower significant data code DAT[7:0] following with a 1 bit acknowledge code ACK, and an 8 bits higher significant data code DAT[15:8] following with a 1 bit acknowledge code ACK. Subsequently, the read/write ending code WP is received indicating that the ith differential communication interface F(i) is terminating the current read transmission and thus indicating that the current read transmission is completed. Those of ordinary skill in the art should understand that the codes and length processed during the writing transmission 700 illustrated in FIG. 7 are only illustrative and not intended to be limiting.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

What is claimed is:

1. A daisy-chain battery cells system comprising:
a plurality of battery cells or battery cell groups {C(i), i=1, . . . , N} connected in series between a low side terminal and a high side terminal, wherein N is an integer greater than 1;
a corresponding plurality of voltage measuring modules {S(i), i=1, . . . , N}, wherein each one of the corresponding plurality of voltage measuring modules {S(i), i=1, . . . , N} is coupled to a corresponding one of the plurality of battery cells or battery cell groups {C(i), i=1, . . . , N} and is configured to measure the voltage of the corresponding one battery cell or battery cell group;
a corresponding plurality of differential communication interfaces {F(i), i=1, . . . , N}, wherein each one of the corresponding plurality of differential communication interfaces {F(i), i=1, . . . , N} is coupled to a corresponding one of the plurality of voltage measuring modules {S(i), i=1, . . . , N}; wherein
for each i=1, N, the $i^{th}$ differential communication interface F(i) comprises a low side interface FL(i) and a high side interface FU(i), and wherein the low side interface FL(i) comprises a first low side differential pin pair (CLL(i)+, CLL(i)−) and a second low side differential pin pair (DAL(i)+, DAL(i)−), and wherein the high side interface FU(i) comprises a first high side differential pin pair (CLU(i)+, CLU(i)−) and a second high side differential pin pair (DAU(i)+, DAU(i)−); and wherein
for each i=1, . . . , N−1, the first low side differential pin pair (CLL(i)+, CLL(i)−) of the $i^{th}$ differential communication interface F(i) is configured as a differential input pin pair, and wherein the first high side differential pin pair (CLU(i)+, CLU(i)−) of the $i^{th}$ differential communication interface F(i) is configured as a differential output pin pair and is coupled to the first low side differential pin pair (CLL(i+1)+, CLL(i+1)−) of the $(i+1)^{th}$ differential communication interface F(i+1), and wherein the second low side differential pin pair (DAL(i)+, DAL(i)−) of the $i^{th}$ differential communication interface F(i) is configured as a differential input/output pin pair, and wherein the second high side differential pin pair (DAU(i)+, DAU(i)−) of the $i^{th}$ differential communication interface F(i) is configured as a differential input/output pin pair and is coupled to the second low side differential pin pair (DAL(i+1)+, DAL(i+1)−) of the $(i+1)^{th}$ differential communication interface F(i+1); and wherein
the low side interface FL(1) of the first differential communication interface F(1) is coupled to a controller; and wherein
the high side interface FU(N) of the $N^{th}$ differential communication interface F(N) is configured to receive a preset data/signal; and wherein the high side interface FU(i) of the $i^{th}$ differential communication interface F(i) comprises:
a high side transmission protocol management module having a first high side differential output pin pair (SCLU+_OUT, SCLU−_OUT), a second high side differential input pin pair (SDAU+_IN, SDAU−_IN)

and a second high side differential output pin pair (SDAU+_OUT, SDAU−_OUT);

a first high side driver, comprising a first transistor and a second transistor coupled in series between a high side power supply and a high side ground, and a third transistor and a fourth transistor coupled in series between the high side power supply and the high side ground, wherein the positive pin SCLU+_OUT of the first high side differential output pin pair (SCLU+_OUT, SCLU−_OUT) is coupled to a gate terminal of the first transistor and further coupled to a gate terminal of the second transistor via a first inverter, and wherein the negative pin SCLU−_OUT of the first high side differential output pin pair (SCLU+_OUT, SCLU−_OUT) is coupled to a gate terminal of the third transistor via a second inverter and further coupled to a gate terminal of the fourth transistor, and wherein a common connection of the first transistor and the second transistor is coupled to the positive pin CLU(i)+ of the first high side differential pin pair (CLU(i)+, CLU(i)−), and wherein a common connection of the third transistor and the fourth transistor is coupled to the negative pin CLU(i)− of the first high side differential pin pair (CLU(i)+, CLU(i)−);

a second high side driver, comprising a fifth transistor and a sixth transistor coupled in series between the high side power supply and the high side ground, wherein the positive pin SDAU+_OUT of the second high side differential output pin pair (SDAU+_OUT, SDAU−_OUT) is coupled to a gate terminal of the fifth transistor and further coupled to a gate terminal of the sixth transistor via a third inverter, and wherein a common connection of the fifth transistor and the sixth transistor is coupled to the positive pin DAU(i)+ of the second high side differential pin pair (DAU(i)+, DAU(i)−); and a third high side driver, comprising a seventh transistor and an eighth transistor coupled in series between the high side power supply and the high side ground, wherein the negative pin SDAU−_OUT of the second high side differential output pin pair (SDAU+_OUT, SDAU−_OUT) is coupled to a gate terminal of the seventh transistor via a fourth inverter and further coupled to a gate terminal of the eighth transistor, and wherein a common connection of the seventh transistor and the eighth transistor is coupled to the negative pin DAU(i)− of the second high side differential pin pair (DAU(i)+, DAU(i)−).

2. The daisy-chain battery cells system of claim 1, wherein, for each i=1, N, a logic high on the pin CLL(i)+ with a logic low on the pin CLL(i)− indicates a logic high of a data/signal CLL(i) transmitted on the first low side differential pin pair (CLL(i)+, CLL(i)−), and a logic low on the pin CLL(i)+ with a logic high on the pin CLL(i)− indicates a logic low of the data/signal CLL(i) transmitted on the first low side differential pin pair (CLL(i)+, CLL(i)−); and wherein for each i=1, N, a logic high on the pin DAL(i)+ with a logic low on the pin DAL(i)− indicates a logic high of a data/signal DAL(i) transmitted on the second low side differential pin pair (DAL(i)+, DAL(i)−), and a logic low on the pin DAL(i)+ with a logic high on the pin DAL(i)− indicates a logic low of the data/signal DAL(i) transmitted on the second low side differential pin pair (DAL(i)+, DAL(i)−); and wherein for each i=1, N, a logic high on the pin CLU(i)+ with a logic low on the pin CLU(i)− indicates a logic high of a data/signal CLU(i) transmitted on the first high side differential pin pair (CLU(i)+, CLU(i)−), and a logic low on the pin CLU(i)+ with a logic high on the pin CLU(i)− indicates a logic low of the data/signal CLU(i) transmitted on the first high side differential pin pair (CLU(i)+, CLU(i)−); and wherein for each i=1, N, a logic high on the pin DAU(i)+ with a logic low on the pin DAU(i)− indicates a logic high of a data/signal DAU(i) transmitted on the second high side differential pin pair (DAU(i)+, DAU(i)−), and a logic low on the pin DAU(i)+ with a logic high on the pin DAU(i)− indicates a logic low of the data/signal DAU(i) transmitted on the second high side differential pin pair (DAU(i)+, DAU(i)−).

3. The daisy-chain battery cells system of claim 1, wherein, the first low side differential pin pair (CLL(1)+, CLL(1)−) of the first differential communication interface F(1) is configured as a clock input pin pair to receive a clock signal sent by the controller, and the second low side differential pin pair (DAL(1)+, DAL(1)−) of the first differential communication interface F(1) is configured as a data transmission pin pair to receive instructions/data from the controller and/or to send feedback data to the controller; and wherein for each i=2, N, the first low side differential pin pair (CLL(i)+, CLL(i)−) of the $i^{th}$ differential communication interface F(i) is configured as a clock input pin pair to receive a clock signal sent by the first high side differential pin pair (CLU(i−1)+, CLU(i−1)−) of the (i−1)th differential communication interface F(i−1), and the second low side differential pin pair (DAL(i)+, DAL(i)−) of the $i^{th}$ differential communication interface F(i) is configured as a data transmission pin pair to receive instructions/data from the second high side differential pin pair (DAU(i−1)+, DAU(i−1)−) of the (i−1)th differential communication interface F(i−1) and/or to send feedback data to the second high side differential pin pair (DAU(i−1)+, DAU(i−1)−) of the (i−1)th differential communication interface F(i−1).

4. The daisy-chain battery cells system of claim 1, wherein the positive pin SDAU+_IN and the negative pin SDAU−_IN of the second high side differential input pin pair (SDAU+_IN, SDAU−_IN) are respectively coupled to the positive pin DAU(i)+ and the negative pin DAU(i)− of the second high side differential pin pair (DAU(i)+, DAU(i)−).

5. The daisy-chain battery cells system of claim 1, wherein the low side interface FL(i) of the $i^{th}$ differential communication interface F(i) comprises:

a low side transmission protocol management module having a first low side differential input pin pair (SCLL+_IN, SCLL−_IN), a second low side differential input pin pair (SDAL+_IN, SDAL−_IN) and a second low side differential output pin pair (SDAL+_OUT, SDAL−_OUT);

a first low side driver, comprising a ninth transistor and a ten transistor coupled in series between a low side power supply and a low side ground, wherein the positive pin SDAL+_OUT of the second low side differential output pin pair (SDAL+_OUT, SDAL−_OUT) is coupled to a gate terminal of the ninth transistor and further coupled to a gate terminal of the tenth transistor via a fifth inverter, and wherein a common connection of the ninth transistor and the tenth transistor is coupled to the positive pin DAL(i)+ of the second low side differential pin pair (DAL(i)+, DAL(i)−); and a second low side driver, comprising an eleventh transistor and a twelfth transistor coupled in series between the low side power supply and the low side ground, wherein the negative pin SDAL−_OUT of the second low side differential output pin pair (SDAL+_OUT, SDAL−_OUT) is coupled to a gate terminal of the eleventh transistor via a sixth inverter and further coupled to a gate terminal of the twelfth transistor, and wherein a common connection of the eleventh transistor and the twelfth transistor is coupled to the negative pin DAL(i)− of the second low side differential pin pair (DAL(i)+, DAL(i)−).

6. The daisy-chain battery cells system of claim 5, wherein the positive pin SCLL+_IN and the negative pin SCLL−_IN of the first low side differential input pin pair (SCLL+_IN, SCLL−_IN) are respectively coupled to the positive pin CLL(i)+ and the negative pin CLL(i)− of the first low side differential pin pair (CLL(i)+, CLL(i)−), and wherein the positive pin SDAL+_IN and the negative pin SDAL−_IN of the second low side differential input pin pair (SDAL+_IN, SDAL−_IN) are respectively coupled to the positive pin DAL(i)+ and the negative pin DAL(i)− of the second low side differential pin pair (DAL(i)+, DAL(i)−).

7. The daisy-chain battery cells system of claim 1, wherein once the signal/data DAL(i) transmitted at the second low side differential pin pair (DAL(i)+, DAL(i)−) changes from logic high to logic low while the signal/data CLL(i) transmitted at the first low side differential pin pair (CLL(i)+, CLL(i)−) is logic high, the $i^{th}$ differential communication interface F(i) is beginning with a read/write transmission.

8. The daisy-chain battery cells system of claim 1, wherein once the signal/data DAL(i) transmitted at the second low side differential pin pair (DAL(i)+, DAL(i)−) changes from logic low to logic high while the signal/data CLL(i) transmitted at the first low side differential pin pair (CLL(i)+, CLL(i)−) is logic high the $i^{th}$ differential communication interface F(i) is terminating a current read/write transmission.

9. The daisy-chain battery cells system of claim 1, wherein once the $i^{th}$ differential communication interface F(i) is beginning with a read/write transmission, the $i^{th}$ differential communication interface F(i) starts to process a current read/write transmission with its second low side differential pin pair (DAL(i)+, DAL(i)−) and its second high side differential pin pair (DAU(i)+, DAU(i)−) starting to transmit data/command.

10. The daisy-chain battery cells system of claim 9, wherein during a write transmission to write data/command into the plurality of differential communication interfaces {F(i), i=1, . . . , N}, an acknowledge code is used to inform an emitter which sends the data/command to the second low side differential pin pair (DAL(i)+, DAL(i)−) of the $i^{th}$ differential communication interface F(i) that a current byte transmission is completed and a next byte can be sent out.

11. The daisy-chain battery cells system of claim 9, wherein during a read transmission to read data/command from the plurality of differential communication interfaces {F(i), i=1, . . . , N}, an acknowledge code is used to inform an emitter which sends the data/command to the second high side differential pin pair (DAU(i)+, DAU(i)−) of the $i^{th}$ differential communication interface F(i) that a current byte transmission is completed and a next byte can be sent out.

12. The daisy-chain battery cells system of claim 1, wherein for each i=1, . . . , N, the signal/data CLL(i) transmitted on the first low side differential pin pair (CLL(i)+, CLL(i)−) of the $i^{th}$ differential communication interface F(i) is used as a clock signal CLL(i), and wherein the second low side differential pin pair (DAL(i)+, DAL(i)−) of the $i^{th}$ differential communication interface F(i) is configured to process read of each bit of the data/command DAL(i) transmitted to the second low side differential pin pair (DAL(i)+, DAL(i)−) at each logic high pulse of the clock signal CLL(i).

13. The daisy-chain battery cells system of claim 1, wherein for each i=1, N, the signal/data CLU(i) transmitted on the first high side differential pin pair (CLU(i)+, CLU(i)−) of the $i^{th}$ differential communication interface F(i) is used as a clock signal CLU(i), and wherein the second high side differential pin pair (DAU(i)+, DAU(i)−) of the $i^{th}$ differential communication interface F(i) is configured to process write of each bit of the data/command DAU(i) transmitted to high side differential pin pair (DAU(i)+, DAU(i)−) at each logic high pulse of the clock signal CLU(i).

14. The daisy-chain battery cells system of claim 1, wherein for each i=1, N, the $i^{th}$ differential communication interface F(i) may further comprise:

a first level shift circuit, coupled between the first low side differential pin pair (CLL(i)+, CLL(i)−) and the first high side differential pin pair (CLU(i)+, CLU(i)−) and configured to provide a first predetermined voltage level; and a second level shift circuit coupled between the second low side differential pin pair (DAL(i)+, DAL(i)−) and the second high side differential pin pair (DAU(i)+, DAU(i)−) and configured to provide a second predetermined voltage level.

* * * * *